United States Patent
Niu et al.

(10) Patent No.: US 11,887,400 B2
(45) Date of Patent: Jan. 30, 2024

(54) FINGERPRINT IDENTIFICATION DISPLAY SUBSTRATE AND METHOD OF USE THEREOF, AND DISPLAY PANEL

(71) Applicant: BOE TECHNOLOGY GROUP CO., LTD., Beijing (CN)

(72) Inventors: Jing Niu, Beijing (CN); Chengchung Yang, Beijing (CN); Fangzhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 491 days.

(21) Appl. No.: 16/343,769

(22) PCT Filed: Nov. 15, 2018

(86) PCT No.: PCT/CN2018/115672
§ 371 (c)(1),
(2) Date: Apr. 21, 2019

(87) PCT Pub. No.: WO2019/205592
PCT Pub. Date: Oct. 31, 2019

(65) Prior Publication Data
US 2021/0334498 A1   Oct. 28, 2021

(30) Foreign Application Priority Data
Apr. 24, 2018 (CN) .......................... 201810371548.5

(51) Int. Cl.
*G06V 40/13* (2022.01)
*H10K 50/86* (2023.01)
(Continued)

(52) U.S. Cl.
CPC ....... *G06V 40/1318* (2022.01); *H10K 50/865* (2023.02); *H10K 59/12* (2023.02); *H10K 59/60* (2023.02); *H10K 59/65* (2023.02)

(58) Field of Classification Search
CPC ... G06K 9/0004; G06F 3/042; H01L 27/3227; H01L 27/3225
See application file for complete search history.

(56) References Cited

U.S. PATENT DOCUMENTS

| 2010/0007632 A1* | 1/2010 | Yamazaki | ............. G06F 3/0421 345/175 |
| 2012/0286328 A1* | 11/2012 | Nishida | ............... H01L 31/1035 257/188 |

(Continued)

FOREIGN PATENT DOCUMENTS

| CN | 105867696 A | * 8/2016 | ............. G06F 3/042 |
| CN | 105989353 A | 10/2016 | |

(Continued)

OTHER PUBLICATIONS

SecuGen (NPL article, SEIR™ Optic Technology, published in 2004) (Year: 2004).*

(Continued)

*Primary Examiner* — Yuzhen Shen
(74) *Attorney, Agent, or Firm* — Syncoda LLC; Feng Ma

(57) ABSTRACT

A display substrate includes a base substrate, and a plurality of light emitters and a plurality of light sensors over the base substrate. The light emitters and light sensors are configured to respectively emit lights towards, and sense lights reflected by, a pattern to be detected, such as a fingerprint. At least one light emitter includes a first electrode, a light-emitting layer, and a second electrode, sequentially over the base substrate. At least one light sensor includes a third electrode, a photosensitive layer, and a fourth electrode, sequentially over the base substrate. The first electrode and the third electrode are integral or the second electrode and the fourth electrode are integral. A method of using the display substrate to identify a pattern such as a fingerprint can be (Continued)

employed by a display panel containing the display substrate.

16 Claims, 4 Drawing Sheets

(51) Int. Cl.
*H10K 59/12* (2023.01)
*H10K 59/60* (2023.01)
*H10K 59/65* (2023.01)

(56) References Cited

U.S. PATENT DOCUMENTS

| | | | |
|---|---|---|---|
| 2013/0062595 A1* | 3/2013 | Park | H01L 51/4253 257/40 |
| 2015/0337449 A1* | 11/2015 | Chung | C25D 5/34 205/188 |
| 2016/0155782 A1* | 6/2016 | Sato | H01L 27/3227 257/82 |
| 2017/0078513 A1* | 3/2017 | Chang | G06F 3/0304 |
| 2017/0213066 A1* | 7/2017 | Hsieh | G06K 9/0004 |
| 2018/0019288 A1* | 1/2018 | Yang | H01L 31/153 |
| 2018/0060641 A1* | 3/2018 | Kim | G06K 9/00013 |
| 2018/0210571 A1* | 7/2018 | Wang | G06F 3/042 |
| 2019/0080139 A1* | 3/2019 | Reinhold | G06V 40/67 |
| 2020/0243620 A1* | 7/2020 | Abe | H01L 27/3276 |
| 2021/0004556 A1* | 1/2021 | Reinhold | G06K 9/00046 |

FOREIGN PATENT DOCUMENTS

| | | |
|---|---|---|
| CN | 106373969 A | 2/2017 |
| CN | 106684202 A | 5/2017 |
| CN | 107220622 A | 9/2017 |

OTHER PUBLICATIONS

International Search Report in Application No. PCT/CN2018/115672, dated Jan. 30, 2019.
CN First Office Action in Application No. 201810371548.5, dated Mar. 16, 2020.

\* cited by examiner

FINGERPRINT IDENTIFICATION DISPLAY SUBSTRATE AND METHOD OF USE THEREOF, AND DISPLAY PANEL

CROSS-REFERENCE TO RELATED APPLICATION

The present application claims priority to Chinese Patent Application No. 201810371548.5 filed on Apr. 24, 2018, the disclosure of which is hereby incorporated by reference in its entirety.

TECHNICAL FIELD

The present disclosure relates generally to the field of display technologies, and more specifically to a display substrate having a fingerprint identification function, its method of use, and a display panel containing the display substrate.

BACKGROUND

Organic light-emitting diodes (OLEDs) typically comprise organic semiconductors and luminescent materials which can emit lights through carrier injection and recombination driven by an electric field. The working principle for a typical OLED device is as follows:

Under a certain voltage to an ITO transparent electrode and a metal electrode which are used respectively as the anode and cathode of the OLED device, electrons are injected from the cathode into an electron transport layer, and holes are injected from the anode into a hole transport layer. Then the electrons and the holes translocate respectively through the electron transport layer and the hole transport layer to a light-emitting layer, where they meet with each other to thereby form excitons. Then the excitons can excite the luminescent molecules in the light-emitting layer which, after radiation relaxation, can emit visible lights.

The OLED display technology is different from a traditional LCD display technology. In an OLED display panel, there is no need for backlight, and it can use very thin organic coating materials (i.e. organic film layers) and a glass substrate. When currents pass through the organic film layer, the organic materials in these layers can emit lights. Compared with an LCD display panel, the OLED display panel can be made lighter and thinner, can be flexible, can have a greater viewing angle, and can significantly save power.

The working principle for an optical fingerprint identification technology is as follows: when a finger is pressed on an optical lens, the finger is illuminated by a built-in light source, and the reflected light can be projected on the charge coupled device (CCD) by means of a prism. The ridges of the finger (convex portions of the finger with certain widths and certain extending directions) will exhibit as black, whereas the valleys of the finger (concave portions between the ridges) will exhibit as white, in a fingerprint image generated by a fingerprint identification device. The fingerprint image is typically a digital image with multiple grayscales, which allows it to be processed by fingerprint identification algorithms in the fingerprint identification device.

Existing fingerprint identification structure having both an OLED display functionality and a fingerprint identification functionality have weaknesses including low efficiency and poor sensitivity for fingerprint identification.

SUMMARY

In a first aspect, the present disclosure provides a display substrate.

The display substrate includes a base substrate, a plurality of light emitters and a plurality of light sensors, both over the bases substrate. The plurality of light emitters and the plurality of light sensors are configured to respectively emit lights towards, and sense lights reflected by, a pattern to be detected. Each of at least one of the plurality of light emitters comprises a first electrode, a light-emitting layer, and a second electrode, sequentially over the base substrate. Each of at least one of the plurality of light sensors comprises a third electrode, a photosensitive layer, and a fourth electrode, sequentially over the base substrate. The display substrate is configured such that the first electrode and the third electrode are integral or the second electrode and the fourth electrode are integral.

Herein the pattern to be detected by the display substrate can be a fingerprint, but can also be others such as a palm, a face, etc.

According to some embodiments of the disclosure, the photosensitive layer comprises at least one III-V compound.

Optionally, the at least one III-V compound comprises copper indium gallium selenide (CIGS).

The display substrate optionally further includes a plurality of light-shielding members. Each of the plurality of light-shielding members is arranged over, and configured to shield ambient lights from interfering with, each of the at least one of the plurality of light sensors positionally corresponding thereto.

Herein, each of the plurality of light-shielding members can optionally be configured such that an orthographic projection thereof on an upper surface of the base substrate contains an orthographic projection of the each of the at least one of the plurality of light sensors positionally corresponding thereto on the upper surface of the base substrate.

Herein, each of the plurality of light-shielding members can optionally comprise a light-shielding layer. The light-shielding layer can include a metal layer having a thickness of at least 1000 Å.

According to some embodiments of the display substrate, each of the plurality of light-emitters comprises a light-emitting diode. The light-emitting diode can optionally be an organic light-emitting diode (OLED) or a microLED.

According to some embodiments of the display substrate, the first electrode is a first cathode, the second electrode is a first anode, the third electrode is a second cathode, and the fourth electrode is a second anode.

Herein, the first cathode and the second cathode can optionally be integrated.

Furthermore, at least one of the first anode and the second anode can optionally comprise ITO.

The display substrate can further comprise a top substrate over the plurality of light emitters and the plurality of light sensors, and an upper surface of the photosensitive layer has a larger or substantially equal distance to a lower surface of the top substrate than an upper surface of the light-emitting layer.

Herein, a thickness of the photosensitive layer can be smaller than 1 μm.

In the display substrate, the first anode and the second anode can optionally be at a substantially same layer.

According to some embodiments, the display substrate further comprises a plurality of first thin-film transistors and a plurality of second thin-film transistors. Each of the plurality of first thin-film transistors is electrically coupled with, and configured to control emission of lights from, each of the plurality of light emitters corresponding thereto. Each of the plurality of second thin-film transistors is electrically coupled with, and configured to control output of electrical signals from, each of the plurality of light sensors corresponding thereto.

Herein, a gate electrode of each of the plurality of first thin-film transistors and a gate electrode of each of the plurality of second thin-film transistors can optionally be electrically coupled to a same node.

In a second aspect, the present disclosure further provides a method for identifying a pattern using a display substrate that is based on any one of the embodiments as described above.

The method comprises a step where the plurality of light sensors receive optical signals from lights emitted from the plurality of light-emitters and reflected by the pattern, and convert the optical signals into electrical signals.

Prior to the step where the plurality of light sensors receive optical signals from lights emitted from the plurality of light-emitters and reflected by the pattern and convert the optical signals into electrical signals, the method can further include a step of controlling the plurality of light-emitters to emit lights.

After the step where the plurality of light sensors receive optical signals from lights emitted from the plurality of light-emitters and reflected by the pattern, and convert the optical signals into electrical signals, the method can further include a step of controlling the plurality of light sensors to output the electrical signals.

In a third aspect, a display panel is further disclosed, which comprises a display substrate according to any one of the embodiments as described above.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Throughout the disclosure, the terms "thickness", "upper", "lower", "perpendicular", "horizontal", "top", "bottom", "inside", "outside", etc. that denote directions or a positions of a component are all relative terms that reflect only the relative directional or positional relationship based on the drawings, and do not indicate or suggest that the component must be arranged in the denoted direction or at the denoted position, and thus shall not be interpreted as limiting in scope.

In a first aspect, the present disclosure provides a display substrate with a pattern identification function.

The display substrate comprises a base substrate, and a plurality of light emitters and a plurality of light sensors, both over the base substrate. The plurality of light emitters are configured to emit lights towards a pattern to be detected, and the plurality of light sensors are configured to sense lights reflected by the pattern to be detected.

At least one of the plurality of light emitters comprises a first electrode, a light-emitting layer, and a second electrode, which are sequentially over the base substrate. At least one of the plurality of light sensors comprises a third electrode, a photosensitive layer, and a fourth electrode, which are sequentially over the base substrate. The display substrate is configured such that the first electrode and the third electrode are integral or the second electrode and the fourth electrode are integral.

The display substrate can further comprise an opposing substrate, which is arranged to be opposing to the base substrate, and the opposing substrate is over the plurality of light emitters and the plurality of light sensors (i.e. the plurality of light emitters and the plurality of light sensors are between the base substrate and the opposing substrate). The pattern to be detected is thus over a surface of the opposing substrate that is far away from the base substrate.

Herein the pattern can be a fingerprint, but can also be a palm print, a face, or anything similar. The plurality of light sensors can sense the lights reflected by the pattern to be detected by converting the optical signals into electrical signals. Furthermore, the display substrate can be part of a display panel.

It is noted that in the following, all the embodiments are described with fingerprint as the pattern to be detected which, however, shall not be interpreted as a limitation to the scope of the disclosure.

Figure 1:
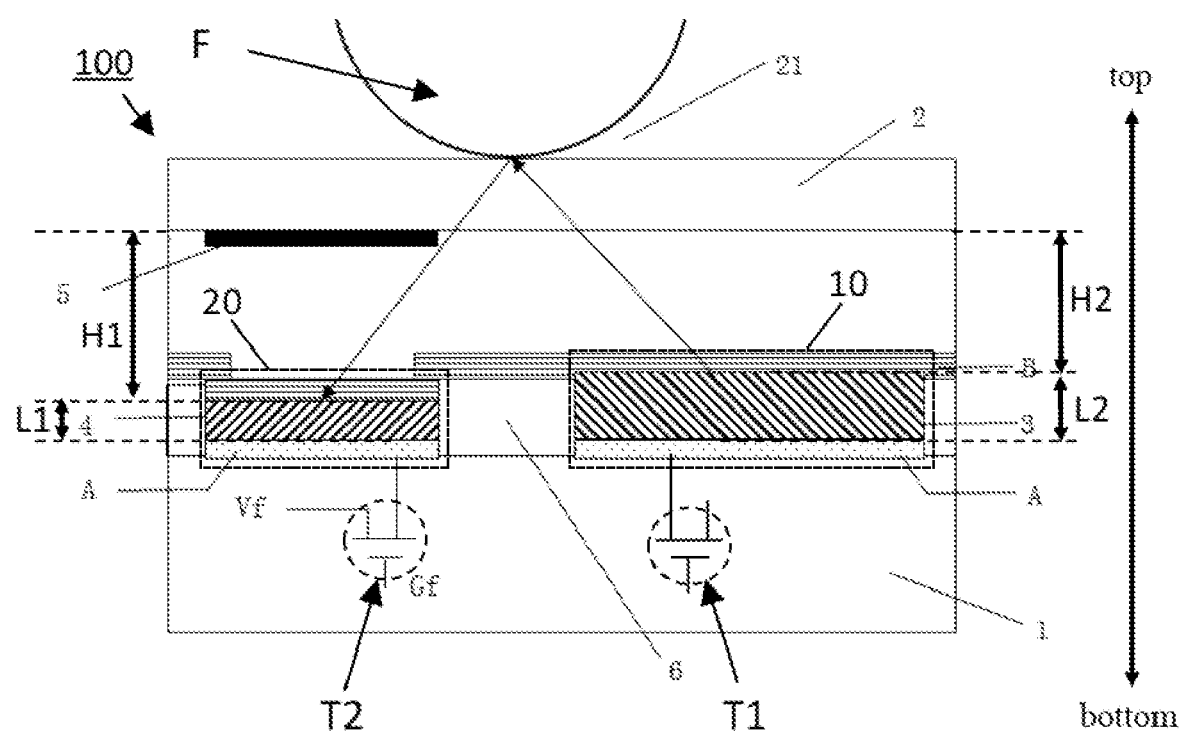
FIG. 1 is a structural diagram of a display substrate with a pattern identification function according to some embodiments of the disclosure.

FIG. 1 illustrates a structural diagram of a display substrate with a fingerprint identification function according to some embodiments of the disclosure. As shown in the figure, the display substrate 100 includes a lower substrate (i.e. the base substrate) 1, an upper substrate (i.e. the opposing substrate) 2, a light emitter 10, and a light sensor 20. Herein each of the light emitter 10, and the light sensor 20 is encircled and thus indicated by a rectangle with dotted lines.

The light emitter 10 comprises a light-emitting layer 3 sandwiched between two electrodes (i.e. the first electrode and the second electrode, which are first anode and first cathode, respectively). The light sensor 20 comprises a photosensitive layer 4, which is also sandwiched between two electrodes (i.e. the third electrode and the fourth electrode, which are second anode and second cathode, respectively).

Specifically, the upper substrate 2 is provided with an effective touch area 21, which is arranged on an upper surface of the upper substrate 2 and is configured to allow a finger to be disposed thereon such that a fingerprint identification process can be performed.

The upper substrate 2 and the lower substrate 1 are separated from each other in a top-to-bottom direction (as shown by the double-headed arrow). According to some embodiments, the upper substrate 2 can comprise a packaging membrane or a glass plate. In addition, the upper substrate 2 and the light-emitting layer 3 can be configured to be separated from each other with a pre-set distance along a direction perpendicular to the upper substrate 2, which is substantially also the top-to-bottom direction illustrated by the double-headed arrow.

Figure 2:
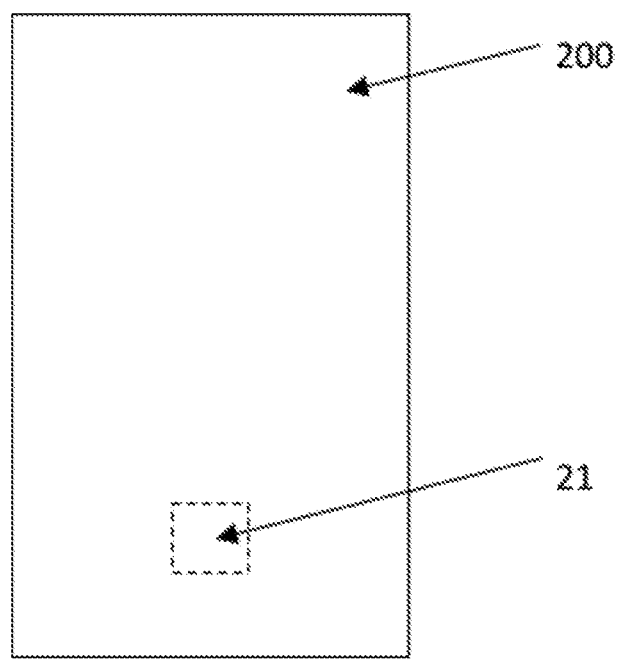
FIG. 2 is a top view of a display panel having an effective touch area according to some embodiments of the disclosure.

Herein the effective touch area 21 is referred to as an area in a display panel that is configured for disposing or touching a finger thereon to thereby allow identification of a fingerprint of the finger. For example, the display substrate with fingerprint identification function 100 as illustrated in FIG. 1 and described herein can be employed in a mobile phone as a mobile phone display panel 200, whose top view is illustrated in FIG. 2. As shown in FIG. 2, the effective touch area 21 is substantially a designated region on a front-facing surface of the display panel 200, and the display substrate 100 is substantially arranged within the effective touch area 21 to thereby allow the fingerprint identification for the display panel 200.

It is noted that in FIG. 1 and FIG. 2, the effective touch area 21 is only illustratingly shown, and there is no limitation to the actual positions in the display panel for arranging the effective touch area 21 (i.e. the display substrate 100), as long as the arrangement of the effective touch area 21 can sufficiently allow effective touch of the finger with the effective touch area 21.

As further shown in FIG. 1, the light-emitting layer 3 is disposed between the upper substrate 2 and the lower substrate 1, and is configured to upwardly emit lights. As such, during the process for fingerprint identification, when a finger F touches onto an upper surface of the upper substrate 2 within the effective touch area 21, lights emitted from the light-emitting layer 3 can be reflected by the finger F touching the upper surface of the upper substrate 2 within the effective touch area 21, such that a subsequent fingerprint identification processed can be realized.

In the display substrate with a fingerprint identification function, the photosensitive layer 4 comprises a photosensitive film which can, upon irradiation to a light, convert an optical signal from the light into an electrical signal. According to some embodiments of the disclosure, the photosensitive film of the photosensitive layer 4 can comprise a solar thin film cell, such as CIGS (short for $CuIn_xGa_{(1-x)}Se_2$).

Herein, the solar thin film cell is substantially an existing solar photovoltaic technology. A solar cell, also known as a "solar chip" or a "photovoltaic cell," typically comprises a thin sheet of photoelectric semiconductor material which, upon exposure to a light such as a sunlight, can directly generate electricity from the light and can immediately output a current. For a CIGS solar thin film cell in particular, it has advantages including a good stability, a good radiation resistance, low manufacturing costs, and a high efficiency, etc.

According to some other embodiments, the photosensitive layer 4 can comprise a film of a compound comprising Group III-V elements (i.e. a film comprising a III-V compound). As such, photosensitive layer 4 can be a solar film cell made from a film of a compound containing Group III-V elements. Such a composition for the photosensitive layer 4 can improve the efficiency and sensitivity of fingerprint identification.

Herein in the III-V compound that forms the composition of the photosensitive layer 4, the Group III-V elements can include at least one of the Group III elements (including B, Al, Ga, In) and at least one of Group V elements (including N, P, As, Sb) in the periodic table. Examples of a III-V compound include gallium arsenide (GaAs), indium phosphide (InP), and gallium nitride (GaN).

The photosensitive layer 4 is disposed between the upper substrate 2 and the lower substrate 1, and is configured to receive optical signals from the lights emitted from the light-emitting layer 3 and reflected by the finger touching the effective touch area 21, and then to convert the optical signals into electrical signals.

According to some embodiments, the display panel 200 containing the display substrate 100 comprises a controller configured to receive and process the electrical signals transmitted from the photosensitive layer 4, such that the fingerprint identification can be realized.

According to some other embodiments, a controller is integrated in the display substrate 100, and such display substrate-integrated controller can, in addition to realize a display control, be independently utilized to receive and process the electrical signals transmitted from the photosensitive layer 4 to thereby realize fingerprint identification.

Taken together, the above mentioned display substrate 100 with fingerprint identification comprises a light-emitting layer 3 and a photosensitive layer 4, and the photosensitive layer 4 is configured to comprise a solar thin film cell for receiving optical signals from lights emitted from the light-emitting layer 3 and reflected by the finger touching the effective touch area 21, and then converting the optical signals into electrical signals. The electrical signals are then processed and analyzed by the controller for subsequent fingerprint identification.

Furthermore, the photosensitive layer 4 can comprises a copper indium gallium selenide (CIGS) film. For example, the photosensitive layer 4 can comprise a solar thin film cell comprising a CIGS film, as such the fingerprint identification sensitivity can be increased. The copper indium gallium selenide (CIGS) film has advantages including good photovoltaic characteristics, a stable performance, a strong radiation resistance, and a high photoelectric conversion efficiency, and thus it has been widely used in the field of thin film solar cells. As such, by utilizing a CIGS film as a photosensitive layer 4 in a display substrate having fingerprint identification function 100, the display substrate 100 can have a high photosensitivity allowing for an improved fingerprint identification sensitivity.

According to some embodiments as also shown in FIG. 1, the photosensitive layers 4 and the light-emitting layer 3 are physically separated (thus electrically insulated) from one another yet still share a common cathode B. Such a configuration allows the display substrate 100 to be easily manufactured. Specifically, by configuring that the photosensitive layers 4 and the light-emitting layer 3 share a common cathode, at least one patterning process can be saved, leading to a simplified manufacturing process and a reduced manufacturing cost for the display substrate 100.

It is noted that according to some other embodiments, the photosensitive layers 4 and the light-emitting layer 3 do not share a common cathode B, but instead has their respective cathode, which can optionally be arranged at a substantially same layer to simplify the manufacturing process thereof.

With further reference to FIG. 1, according to some embodiments of the display substrate, the photosensitive layers 4 and the light-emitting layer 3 are further configured to have their respective anode arranged in a substantially same layer, such that the anode for the photosensitive layers 4 and the anode for the light-emitting layer 3 can be manufactured at a same manufacturing step, which can simplify the manufacturing process and reduce the manufacturing cost for the display substrate 100.

With further reference to FIG. 1, according to some embodiments of the display substrate, a distance between an upper surface of the photosensitive layers 4 and a lower surface of the upper substrate 2 is configured to be more than or substantially equal to a distance between an upper surface of the light-emitting layer 3 and a lower surface of the upper substrate 2, and a thickness L1 of the photosensitive layers 4 is smaller than 1 micron (μm).

For example, the distance between an upper surface of the photosensitive layers 4 and a lower surface of the upper substrate 2 is denoted as H1, and the distance between an upper surface of the light-emitting layer 3 and a lower surface of the upper substrate 2 is denoted as H2, then: H1≥H2. The above configuration is beneficial to the manufacturing of the cathode B, which can effectively prevent the cathode B from breaking, in turn leading to an increased reliability of the display substrate 100 manufactured thereby.

In the embodiments of the display substrate shown in FIG. 1, the photosensitive layer 4 and the light-emitting layer 3 is arranged at a substantially same plane that is parallel to the lower substrate 1, and the photosensitive layers 4 has a smaller thickness (i.e. L1) than the light-emitting layer 3 (whose thickness is denoted as L2). In other words, L1<L2. It is noted that it is only illustrating and there are other possibilities and other relationships.

As further illustrated in FIG. 1, according to some embodiments, the display substrate with fingerprint identification function 100 further comprises a light-shielding member 5, which is arranged over a side of the upper substrate 2 facing (in close proximity to) the photosensitive layer 4, and is configured to shield an ambient light from interfering with the photosensitive layer 4. For example, the light-shielding member 5 can be arranged on the lower surface of the upper substrate 2 and the light-shielding member 5 is further configured to face the photosensitive layer 4 along a direction perpendicular to the upper substrate 2 (i.e. along the double-headed arrow).

As such, by configuring a light-shielding member 5 as described and illustrated above, lights from an environment (i.e. ambient lights) can be shielded, thus the interference to the photosensitive layer 4 that is caused by the ambient lights can be effectively reduced, which in turn can increase the accuracy and sensitivity for fingerprint identification for the display substrate 100.

It is noted that in addition to the above positional configuration illustrated in FIG. 1, the light-shielding member 5 can also be arranged at other positions over the photosensitive layer 4, as long as it can shield the ambient lights and reduce the interferences to the photosensitive layer 4 caused by the ambient lights Furthermore, the light-shielding member 5 can be configured such that an orthographic projection of the light-shielding member 5 on a plane parallel to a plane having the photosensitive layer 4 at least covers an orthographic projection of the photosensitive layer 4 on a same plane. As such, the ambient lights can be effectively shielded by the light-shielding member 5, the interference to the photosensitive layer 4 that is caused by the ambient lights can be effectively reduced, which in turn can increase the accuracy and sensitivity for fingerprint identification for the display substrate 100.

Furthermore, the light-shielding member 5 can comprise a light-shielding layer, which can be manufactured by an evaporation method. The light-shielding layer can comprise a metal layer having a thickness of 1000 Å (angstroms) or more, to thereby ensure that the light-shielding layer is non-transparent to allow it to shield the lights from the environment. According to some embodiments, the light shielding layer can be a molybdenum layer having a thickness of 2000 Å or more. Other metal layers can comprise copper layer, but their thickness can be adjusted based on practical needs. The light shielding layer can have other non-metal compositions and can have a different thickness.

According to some embodiments of the disclosure, the light-emitting layer 3 can be a light-emitting diode, which can be an organic light-emitting diode (OLED), a micro organic light-emitting diode (MicroOLED), etc. The light-emitting diode can have a structure of a regular OLED, whose description is skipped herein.

It is noted that in FIG. 1, only one light-emitting layer 3 and only one photosensitive layer 4 are shown in the display substrate 100 for clarity and for illustrating purposes only. Yet the display substrate 100 can include more than one light-emitting layer 3, arranged in an array, and the display substrate 100 can also include more than one photosensitive layer 4, arranged in an array. The more than one photosensitive layer 4 and the more than one light-emitting layer 3 can have a one-to-one corresponding relationship.

By configuring more than one photosensitive layer 4 and the more than one light-emitting layer 3 in the display substrate, the sensitivity and the resolution for fingerprint identification can be increased.

The display substrate 100 disclosed herein can further include a first region for disposing the photosensitive layer 4 and a second region for disposing the light-emitting layer 3. The first region and the second region can be formed at the same time by a pixel defining layer 6.

An evaporation process can be employed to form the photosensitive layer 4 in the first region. For example, a CIGS film can be first formed in the first region to thereby form the photosensitive layer 4, and then a regular OLED film layer fabrication process can be employed to thereby form the OLED film layers in the second region to thereby form the light-emitting layer 3. Alternatively, the OLED film layers can be first fabricated in the second region to thereby form the light-emitting layer 3, and then the CIGS film can be first formed in the first region to thereby form the photosensitive layer 4. There are no limitation to the order for forming the light-emitting layer 3 and the photosensitive layer 4 in the manufacturing process of the display substrate 100.

As such, the first region that is configured for forming the photosensitive layer 4 therewithin can be formed during a substantially same step of forming the pixel defining layer 6, thus the manufacturing process of the display substrate 100 can be simplified, and the manufacturing cost is reduced.

Figure 3:
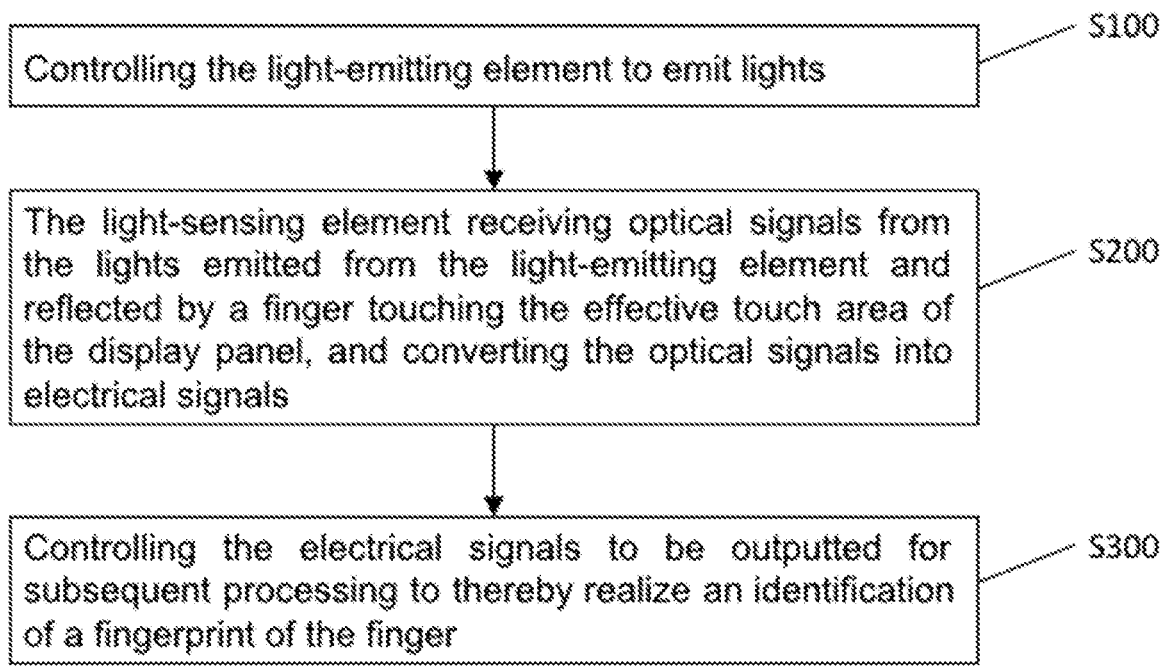
FIG. 3 is a flow chart of a fingerprint identification process using a display substrate according to some embodiments of the disclosure.

In a second aspect, the present disclosure further provides a method of using the above mentioned display substrate to realize the functionality of fingerprint identification (i.e. fingerprint identification method). As shown in FIG. 3, the method includes the following steps:

S100: controlling the light-emitting layer to emit lights;

S200: the photosensitive layer receiving optical signals from the lights emitted from the light-emitting layer and reflected by a finger touching the effective touch area of the display substrate, and converting the optical signals into electrical signals; and S300: controlling the electrical signals to be outputted for subsequent processing to thereby realize an identification of a fingerprint of the finger.

In a display panel containing the display substrate, through the above method, the display panel can realize an integration of the function of display and the function of fingerprint identification. As such, the level of integration for the display substrate can be increased.

Specifically, when a user is using the display panel with fingerprint identification function and is putting his/her finger onto the effective touch area 21 of the display panel (i.e. the display substrate 100), because the upper substrate 2 is at a light-emitting side of the light-emitting layer 3, the finger becomes an object for reflection and reflects a portion of the lights emitted from the light-emitting layer 3. The reflected light changes its path of transmission and then reaches the photosensitive layer 4. The photosensitive layer 4 can then transform the optical signals from the reflected light into electrical signals to thereby realize identification of the fingerprint of the user's finger.

In order to realize a control for the fingerprint identification function, the display substrate 100 comprises a control portion which can, according to some embodiments of the disclosure, comprise a first thin-film transistor and a second thin-film transistor. The first thin-film transistor is configured to control whether the light-emitting layer emits lights, whereas the second thin-film transistor is configured to transmit the electrical signals obtained from the photosensitive layer for subsequent fingerprint identification process.

With further reference to FIG. 1, according to some embodiments of the display substrate, the anode A can comprise indium tin oxide (ITO). The light-emitting layer 3 and the photosensitive layer 4 share a common cathode B. Further in these embodiments of the display panel 100, the first thin-film transistor T1 (as indicated by the circle with dotted line below the light emitter 3 in FIG. 1) and the second thin-film transistor T2 (as indicated by the circle with dotted line below the light sensor 4 in FIG. 1) can be configured to share a common gate electrode, and a node Gf can be electrically coupled or connected to both the gate electrode of the first thin-film transistor and the gate electrode of the second thin-film transistor, so as to provide convenience to control a simultaneous working of both the light-emitting layers 3 and the photosensitive layer 4.

Specifically, a control signal can, by means of the node Gf, to be transmitted to the gate electrode of the first thin-film transistor T1 to control whether the light-emitting layer 3 to emit lights. The control signal can also be transmitting to the gate electrode of the second thin-film transistor T2 to control the electrical signals collected from the photosensitive layer 4 to be transmitted to the node Vf for subsequent processing to realize fingerprint identification.

Figure 4:
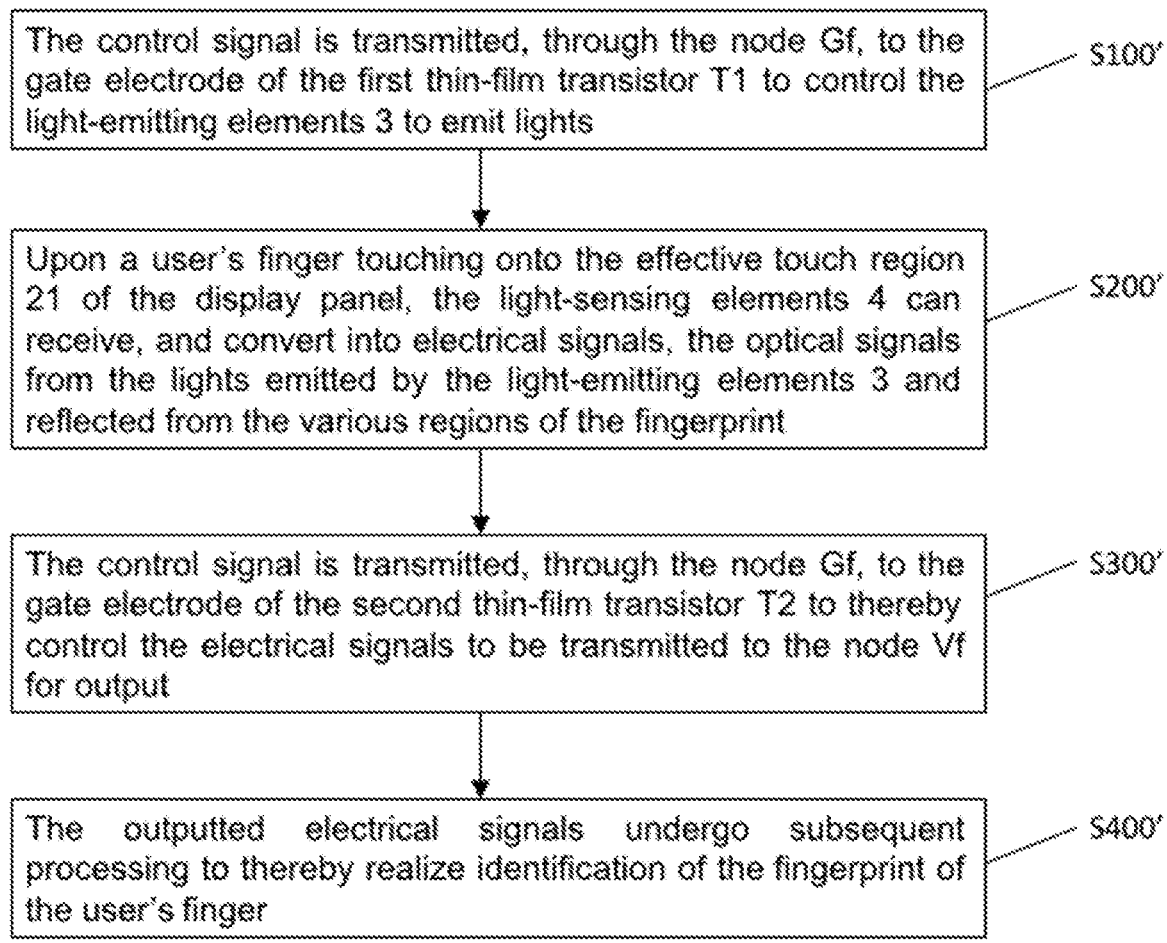
FIG. 4 is a detailed flow chart of the fingerprint identification process using the embodiments of the display substrate shown in FIG. 1.

FIG. 4 illustrates a detailed fingerprint identification process using the embodiments of the display substrate shown in FIG. 1. As shown in FIG. 4, the process includes:

S100': the control signal is transmitted, through the node Gf, to the gate electrode of the first thin-film transistor T1 to control the light-emitting layers 3 to emit lights;

S200': upon a user's finger touching onto the effective touch region 21 of the display panel, the photosensitive layers 4 can receive, and convert into electrical signals, the optical signals from the lights emitted by the light-emitting layers 3 and reflected from the various regions of the fingerprint;

S300': the control signal is transmitted, through the node Gf, to the gate electrode of the second thin-film transistor T2 to thereby control the electrical signals to be transmitted to the node Vf for output.

S400': the outputted electrical signals undergo subsequent processing to thereby realize identification of the fingerprint of the user's finger.

In the embodiments of the display substrate described above and illustrated in FIG. 1, the light-emitting layer 3 and the photosensitive layer 4 share a common cathode B, and the photosensitive layer 4 comprises a solar thin film cell film such as a CIGS film. The following explains a detailed process of fingerprint identification for the display substrate.

On the one hand, ridges of a fingerprint touch the upper substrate 2 and reflect the lights emitted from the light-emitting layer 3 back to the inside of the display substrate, and the CIGS film in the photosensitive layers 4 that positionally correspond to the ridges of the fingerprint can receive the reflected light that is reflected from a surrounding light-emitting layer 3 by the upper substrate 2 and generate currents (i.e. electrical signals), which are then transmitted out by the node Vf.

On the other hand, however, valleys of the fingerprint do not reflect the light emitted from any light-emitting layer 3, thus no electrical signals are generated by the photosensitive layers 4 that positionally correspond to the valleys of the fingerprint.

By analyzing the distribution and intensity of the electrical signals from the photosensitive layers 4, the fingerprint can thus be identified. More detailed information of the fingerprint identification process can reference to existing technologies, whose description is skipped herein.

In a third aspect, the present disclosure further provides a display panel, which includes a display substrate with fingerprint identification function according to any one of the embodiment as described above. The display panel has advantages including an improved fingerprint identification sensitivity, a simplified manufacturing process, and a reduced manufacturing cost.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to so as to encompass such modifications and equivalent structures.

The invention claimed is:

1. A display substrate, comprising:
   a base substrate;
   a plurality of light emitters over the base substrate, configured to emit lights towards a pattern to be detected;
   a plurality of light sensors over the base substrate, configured to sense lights reflected by the pattern to be detected; and
   a top substrate being provided over the plurality of light emitters and the plurality of light sensors;
   wherein:
      each of at least one of the plurality of light emitters comprises a first electrode, a light-emitting layer, and a second electrode, sequentially over the base substrate;
      each of at least one of the plurality of light sensors comprises a third electrode, a photosensitive layer composed of a solar thin film, and a fourth electrode, sequentially over the base substrate;

the first electrode and the third electrode are integral or the second electrode and the fourth electrode are integral;

an upper surface of the photosensitive layer has a larger distance H1 to a lower surface of the top substrate than a distance H2 from an upper surface of the light-emitting layer to the lower surface of the top substrate, to thereby facilitate reliability of the first electrode and the third electrode; wherein the photosensitive layer does not overlap with the light-emitting layer; wherein a lower surface of the photosensitive layer and a lower surface of the light-emitting layer are at a same plane;

the first electrode and the third electrode are integrated as a common cathode; and a light shielding member is arranged over the photosensitive layer and configured to shield ambient light from interfering with light from the light-emitting layer reflected by towards the photosensitive layer to thereby generate electrical signals, thereby improving sensitivity of detecting the pattern.

2. The display substrate of claim 1, wherein the photosensitive layer comprises at least one III-V compound.

3. The display substrate of claim 2, wherein the at least one III-V compound comprises copper indium gallium selenide (CIGS).

4. The display substrate of claim 1, further comprising a plurality of light-shielding members, each arranged over, and configured to shield ambient lights from interfering with, each of the at least one of the plurality of light sensors positionally corresponding thereto.

5. The display substrate of claim 4, wherein each of the plurality of light-shielding members is configured such that an orthographic projection thereof on an upper surface of the base substrate contains an orthographic projection of the each of the at least one of the plurality of light sensors positionally corresponding thereto on the upper surface of the base substrate.

6. The display substrate of claim 4, wherein each of the plurality of light-shielding members comprises a light-shielding layer, wherein the light-shielding layer comprises a metal layer having a thickness of at least 1000 Å.

7. The display substrate of claim 1, wherein each of the plurality of light-emitters comprises a light-emitting diode.

8. The display substrate of claim 7, wherein the light-emitting diode is an organic light-emitting diode (OLED) or a microLED.

9. The display substrate of claim 1, wherein:
the first electrode is a first cathode;
the second electrode is a first anode;
the third electrode is a second cathode; and
the fourth electrode is a second anode.

10. The display substrate of claim 9, wherein at least one of the first anode and the second anode comprises ITO.

11. The display substrate of claim 9, wherein the first anode and the second anode are at a substantially same layer.

12. The display substrate of claim 1, wherein a thickness of the photosensitive layer is smaller than 1 μm.

13. The display substrate of claim 1, further comprising:
a plurality of first thin-film transistors, each electrically coupled with, and configured to control emission of lights from, each of the plurality of light emitters corresponding thereto; and
a plurality of second thin-film transistors, each electrically coupled with, and configured to control output of electrical signals from, each of the plurality of light sensors corresponding thereto.

14. The display substrate of claim 13, wherein a gate electrode of each of the plurality of first thin-film transistors and a gate electrode of each of the plurality of second thin-film transistors are electrically coupled to a same node.

15. A method for identifying a pattern using a display substrate according to claim 1, the method comprising:
the plurality of light sensors receiving optical signals from lights emitted from the plurality of light-emitters and reflected by the pattern, and converting the optical signals into electrical signals.

16. A display panel, comprising a display substrate according to claim 1.

* * * * *